United States Patent [19]

Mahl

[11] 4,085,699
[45] Apr. 25, 1978

[54] MOUNTING FOR ARMS OF A THIN-FILM APPARATUS

[75] Inventor: Gunard O. B. Mahl, San Francisco, Calif.

[73] Assignee: CHA Industries, Menlo Park, Calif.

[21] Appl. No.: 782,822

[22] Filed: Mar. 30, 1977

[51] Int. Cl.² .................................. B05C 13/00
[52] U.S. Cl. .................................. 118/500
[58] Field of Search ............ 118/48, 49, 49.1, 49.5, 118/500

[56] References Cited

U.S. PATENT DOCUMENTS

| | | | |
|---|---|---|---|
| 3,486,237 | 12/1969 | Sawicki | 118/49 |
| 3,598,083 | 8/1971 | Dort et al. | 118/48 |
| 3,643,625 | 2/1972 | Mahl | 118/48 |
| 3,983,838 | 10/1976 | Christensen | 118/49 |

*Primary Examiner*—Wm. Carter Reynolds
*Attorney, Agent, or Firm*—Phillips, Moore, Weissenberger, Lempio & Majestic

[57] ABSTRACT

A thin-film deposition apparatus includes a rotatable assembly, and a plurality of arms of generally T-shaped configuration, each having a rack rotatably mounted thereto. The arms are mountable to the rotatable assembly by seating of the oppositely extending limbs of each T-shaped arm into generally U-shaped depressions defined by the rotatable assembly.

2 Claims, 6 Drawing Figures

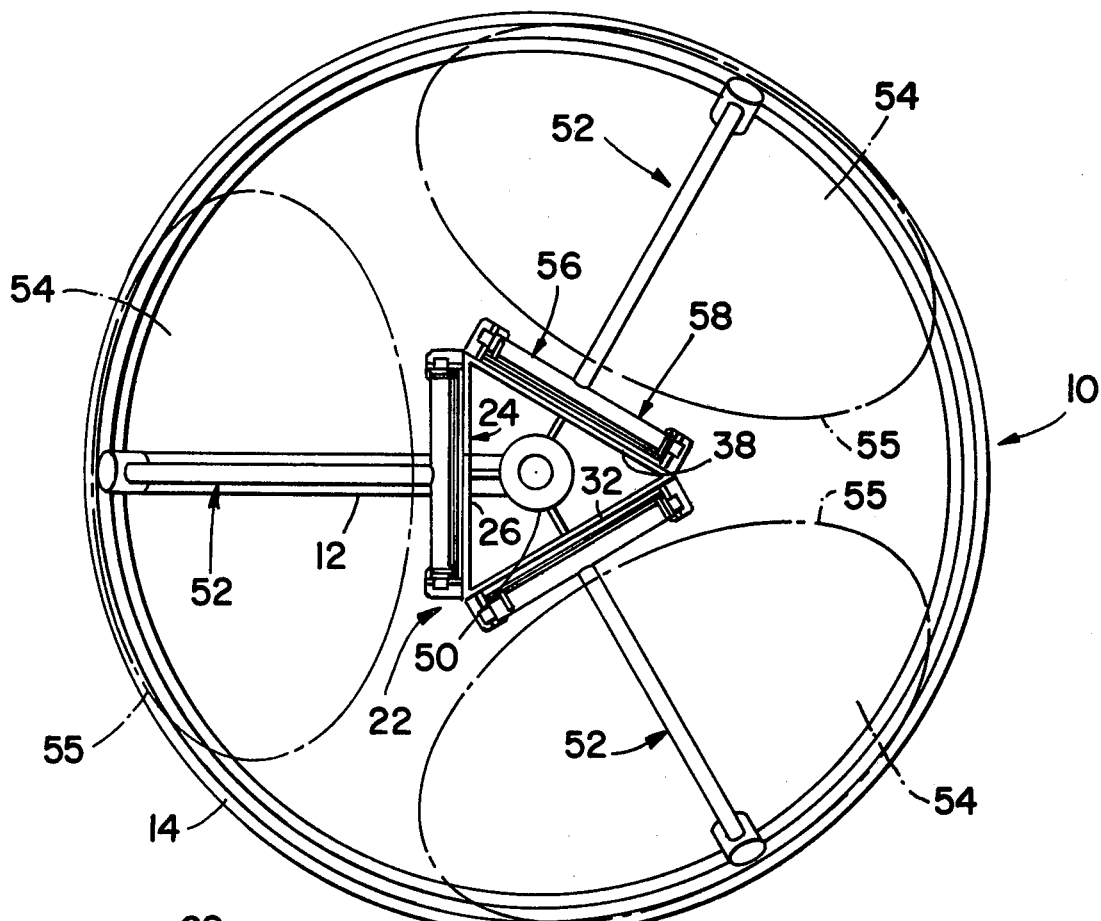
FIG_1
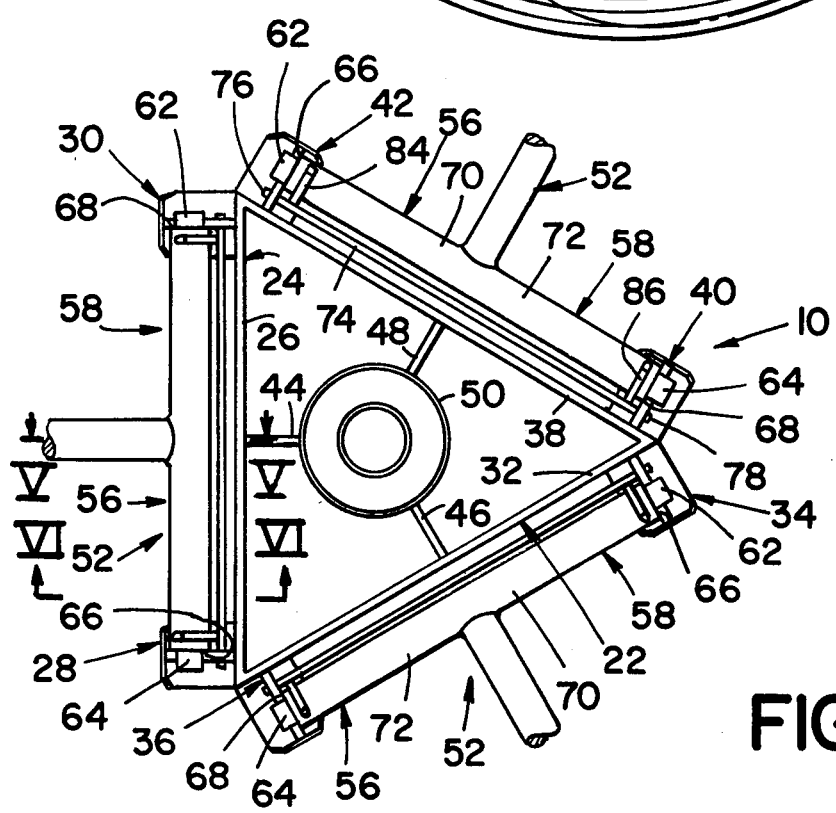
FIG_2

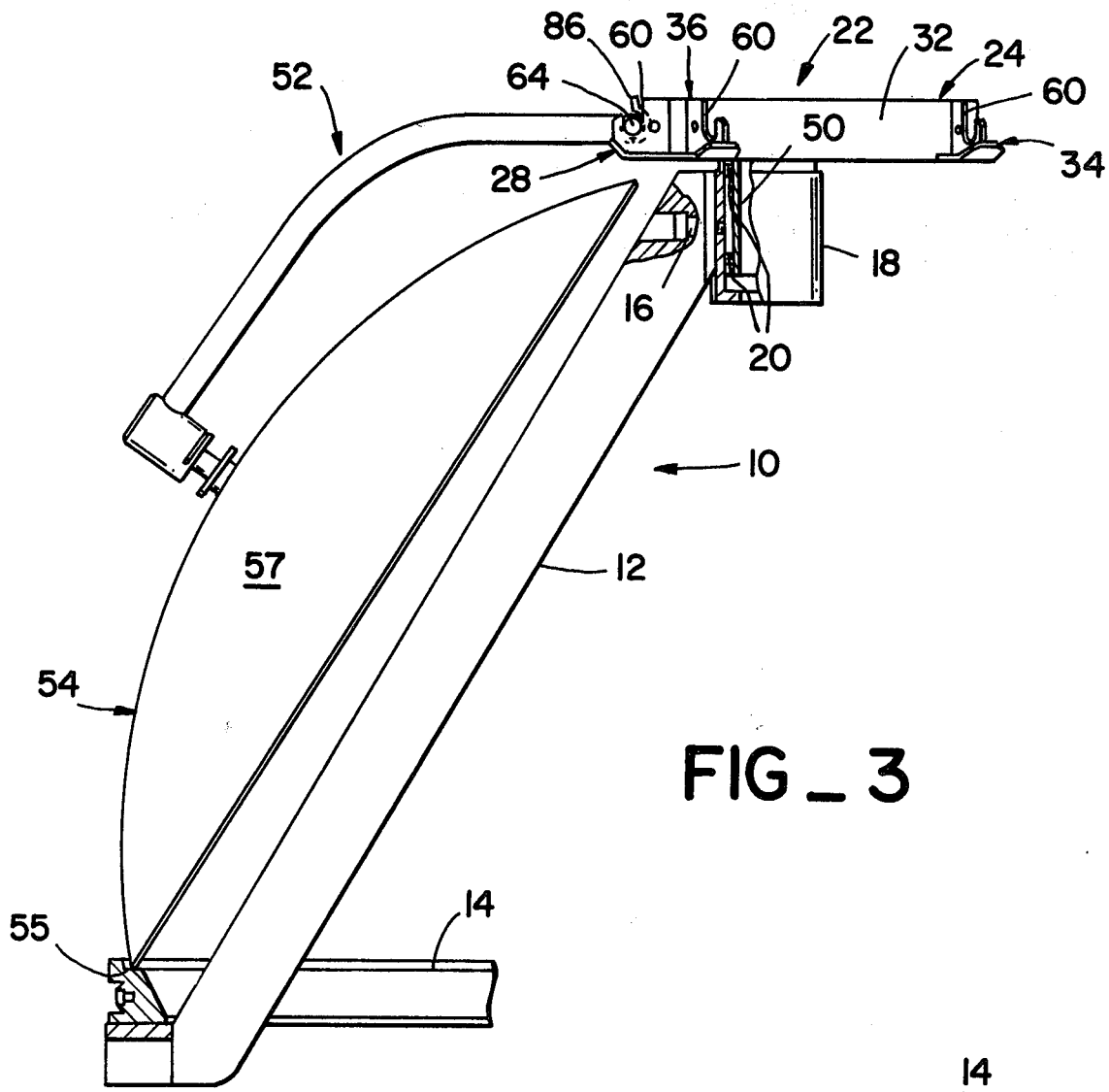
FIG_3
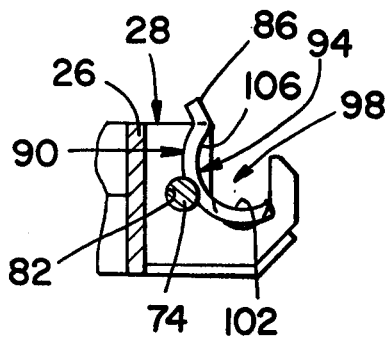
FIG_5
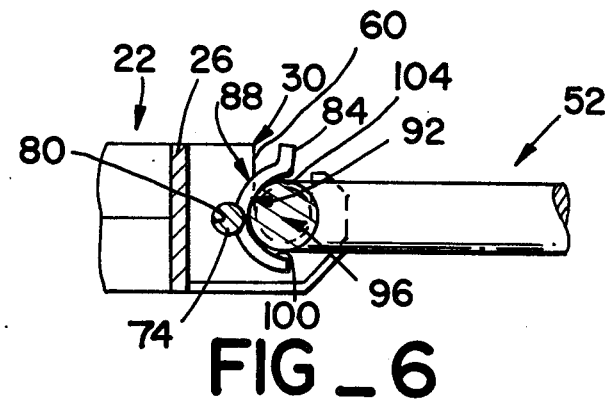
FIG_4
FIG_6

MOUNTING FOR ARMS OF A THIN-FILM APPARATUS

BACKGROUND OF THE INVENTION

This invention relates to thin-filmed deposition apparatus, and more particularly, to such an apparatus including easily removable racks to which substrates may be fitted.

U.S. Pat. No. 3,643,625 to Mahl (assigned to the assignee of this invention) discloses a thin-film deposition apparatus including a plurality of racks, each having a circular outer periphery which is in contact with a support ring and mounted within a vacuum chamber. The racks are rotatably mounted to respective arms of a spider or holder which is provided with a central hub, to which the downwardly and outwardly curved arms are fixed.

As seen in the disclosure of that patent, the substrates are fitted to a rack inwardly of the concave surface thereof, and it will be seen that such concave surface of each rack is relatively difficult to reach, resulting in a relatively great consumption of time in the application and removal of such substrates in situ. As a practical alternative, a rack is normally slipped downwardly of a collar at the end of an arm, and removed entirely from the apparatus, for loading of that rack. Yet it will be seen that this is also a relatively inconvenient operation, requiring moving of, for example, the spider relative to the ring, and awkward movement of the other racks which may be undesired, or difficult to accomplish.

Removal and replacement of individual racks is a twohanded operation and requires average or better than average manual dexterity. Also, because of the relatively large size of the apparatus short or short-armed individuals can not generally successfully carry out the removal and replacement operation. Further, a special tool is generally needed to remove and replace the individual racks since they are relatively heavy (making it difficult to support their weights from the rims thereof), and must usually have a central support pin thereof blindly slid into a hole. This blind insertion of the pin into the hole can, of course, lead to galling which can require replacement or repair of parts. Thus, what results is a relatively slow and difficult operation which can damage the apparatus.

It will also be seen that in accordance with that disclosure, the entire spider with the racks mounted thereon can, and in practice often is, lifted as a sub-assembly from the support ring. This, however, required overhead removal of this sub-assembly can only be accomplished if a rather large overhead clearance is provided as by making the vacuum jar move well overhead. Yet, because of the particular construction involved, it will be seen that an individual arm and rack assembly can not be removed independently of the others as a unit.

Of more general interest is U.S. Pat. No. 3,128,205, wherein racks themselves are not in contact with a support ring. Rather, each rack has fixed thereto a disc, the outer periphery of which is in rolling engagement with a wheel. In each of the aforementioned patents, it is clear that the support rings, and wheel, respectively serve as means for imparting rotary motion to the racks on rotation of the spider.

It is accordingly an object of this invention to provide a thin-film deposition apparatus including a plurality of racks, wherein each rack may be readily removed in a highly convenient manner for loading and unloading thereof.

It is another object of the present invention to provide apparatus which, while fulfilling the above object, can have the angles of the axes of the racks, relative to a vertical centerline of the apparatus, changed by simple moving or replacement of the support ring.

It is a further object of this invention to provide apparatus which, while fulfilling the above objects, is simple in design, effective in use, and much faster to use than prior art apparatus.

Broadly stated, the invention is in a thin-film deposition apparatus comprising rotatable means, a plurality of racks each having a circular outer periphery, a plurality of arm means, each rack being rotatably mounted relative to an arm means, each arm means being operatively associated with the rotatable means, and means for imparting rotary motion to the racks about their centers responsive to rotation of the rotatable means. The improvement comprises means operatively coupling each arm means and the rotatable means for allowing removal of an individual arm means from the rotatable means.

BRIEF DESCRIPTION OF THE DRAWINGS

These and other objects of the invention will become apparent from a study of the following specification and drawings, in which:

FIG. 1 is a plan view of a portion of the thin-film deposition apparatus;

FIG. 2 is a plan view of a portion of the apparatus as shown in FIG. 1;

FIG. 3 is a side elevation of a portion of the apparatus as shown in FIG. 1;

FIG. 4 is a sectional view of the support ring of the apparatus;

FIG. 5 is a sectional view taken along the line V—V of FIG. 2 with the arm removed; and FIG. 6 is a mirror view of a section taken along the lines VI—VI of FIG. 2.

DESCRIPTION OF THE PREFERRED EMBODIMENT

Shown in FIGS. 1-3 is the general overall structure 10 incorporating the invention, which structure can substitute for certain structure of U.S. Pat. No. 3,643,625, and other thin-film deposition apparatus, in accordance with the following. While the following description relates to a single preferred embodiment of the invention, said invention is also useful with other embodiments, for example, with certain commercial apparatus wherein the racks mounting portions of the spider thereof, has discs fixed thereto coaxially with the racks which discs are in rolling engagement with a ring.

As shown in FIGS. 1-3, a bar 12 is rigidly secured to a support ring 14, extending upwardly and inwardly therefrom. Secured to the upper end of the bar 12 by means of a cap screw 16 is a sleeve 18. The sleeve 18 has bearings 20 mounted therein, and a rotatable assembly 22 is associated with the sleeve 18 and bearings 20. The rotatable assembly 22 is made up of a triangular portion 24, the side 26 of the triangular portion 24 having welded thereto flange 28 and flange 30, the side 32 having welded thereto flange 34 and flange 36, and the side 38 having welded thereto flange 40 and flange 42. Each pair of flanges, i.e., 28, 30 and 34, 36, and 40, 42, is in spaced-apart generally parallel relation and falls upon a leg of an equilateral triangle. Brace member 44, 46, 48 are welded to the sides 26, 32, 38, respectively, extending inwardly thereof, the brace members 44, 46, 48 also being welded to a sleeve 50 which extends downwardly and inwardly of the sleeve 18, the bearings 20 providing that the rotatable assembly 22 is rotatable relative to the sleeve 18 and bar 12.

Three arm assemblies 52 are included, each having a rack 54 rotatably mounted thereto. Each arm assembly 52 extends generally along a portion of the associated rack 54, each arm assembly 52 actually being generally T-shaped in configuration, with the limbs 56, 58 thereof extending in generally opposite directions.

The flanges 28, 30, 34, 36, 40, 42 define respective depressions as at 60, each depression 60 being generally U-shaped in configuration (FIG. 6), with the open end thereof extending upwardly. The respective oppositely extending limbs 56, 58 of each generally T-shaped arm assembly 52 define reduced-diameter portions 62, 64 at the ends thereof with stepped portions 66, 68 adjacent such reduced-diameter portions 62, 64 connecting them with the main body portions 70, 72 of the limbs 56, 68. As will be seen in the drawings, the limb 56 of an arm assembly 52 may be placed in the depression 60 of flange 28, with the limb 58 of that arm assembly being placed in the depression 60 of the flange 30. The flanges 28, 30, being part of the rotatable assembly 22, support those oppositely extending limbs 56, 58 so that the upper portion of the arm assembly 52 is supported by the rotatable assembly. The reduced diameter portions 62, 64 are sized to fit quite closely in the generally U-shaped depressions 60, and the stepped portions 66, 68 are appropriately positioned to provide that they are quite close to the flange 28 and flange 30, so that a highly effective positive location of the upper portion of the arm assembly 52 is provided. With this upper location being assured, it is then insured that the circular outer periphery 55 of the rack 54 associated therewith is located to be appropriately supported by the ring 14 as shown in FIG. 3. The mounting of the upper arm portion and the flange 28 is clearly shown in FIG. 6.

Adverting primarily to FIGS. 2, 3, 5 and 6, it will be seen that torque resisting means can preferably be included as a part of the apparatus of the present invention to resist any torque forces which might tend to twist the limbs 56, 58 out of the depressions 60. Such torque forces can develop, primarily on start up, from friction between the periphery 55 of a rack 54 and the ring 14. The particular torque resisting means illustrated and preferred has the advantage that it does not interfere with downward insertion or upward removal of the limbs 56, 58. The preferred torque resisting means comprises a plurality of rods 74 pivotally mounted at ends 76, 78 in holes 80, 82 in each of the pairs of flanges 28, 30 and 34, 36 and 40, 42 so that the rods 74 are substantially parallel to the limbs 56, 58. A plurality of pairs of hooks 84, 86 are attached at their concave sides 88, 90 to extend laterally from the rods 74 with convex sides 92, 94 facing away from the rods 74 to form aligned mouths 96, 98. With limbs 56, 58 removed from the depression 60, the mouths 96, 98 open generally upwardly as seen in FIG. 5. When limbs 56, 58 are moved downwardly into the depression 60, the limbs 56, 58 contact first portions 100, 102 of the mouths 96, 98 thus causing the rods 74 to rotate into the position shown in FIG. 6. On direct upward removal of the limbs 56, 58, the rods 74 contact second portions 104, 106 of the mouths 96, 98 and rotate the rods 74 to the position of FIG. 5 where they remain ready to receive replacement limbs 56, 58.

With the limbs 56, 58 in the position shown more clearly in FIGS. 2 and 6, any torque forces introduced to the limbs 56, 58 which would tend to lift one of these limbs, e.g., 56, out of its respective depression 60 and to pull the other of these limbs, e.g., 58, down against its respective depression 60, would lead to an upward force against the first portion 100, 102, e.g., 100 of a respective one of the mouths 96, 98, e.g., 96 and a downward force against the second portion 104, 106, e.g., 106 of a respective other of the mouths 96, 98, e.g., 98. Thus the torque would be transmitted to the rod 74 and dissipated in the respective flanges e.g., 28, 30.

In the use of this apparatus, it is to be understood that the rotatable assembly 22 can be rotated by the drive apparatus in accordance with U.S. Pat. No. 3,643,625 or other equivalent drive apparatus. Each arm assembly 52 and the rack 54 mounted thereto, may be individually removed from the rotatable assembly 22 by simply lifting the upper portion of the arm assembly 52, so that the limbs 56, 58 are removed from the depressions 60 of the appropriate flanges. It will thus be seen that convenient access to the concave surface 57 of any rack 54 is provided, for convenient placement of the substrates therein. Each individual arm assembly 52 and rack 54 rotatably mounted relative thereto may then be returned to the overall apparatus by simple placement of the reduced diameter portions 62, 64 of the limbs 56, 58 in the depressions 60 of the appropriate flanges.

In accordance with the general operation of the apparatus illustrated, the rotatable assembly 22 is rotated so that the outer periphery 55 of each rack 54 travels on and along the ring 14 so that even coating of the substrates can take place, and shadowing is prevented even with somewhat irregular surfaced substrates.

What is claimed is:

1. In a thin-film deposition apparatus comprising a rotatable means, a plurality of racks, each having a circular outer periphery, a plurality of arm means, each rack being rotatably mounted relative to an arm means, each arm means being operatively associated with the rotatable means, and means for imparting rotary motion to the racks about their centers, responsive to rotation of the rotatable means, the improvement comprising:

means operatively coupling each arm means and the rotatable means for allowing removal of an individual arm means from the rotatable means, said means operatively coupling each arm means and the rotatable means comprising a first arm means portion removably seatable in a first depression defined by the rotatable means and a second arm means portion removably seatable in a second depression defined by the rotatable means, the rotatable means supporting said first and second arm means portion each arm means being generally T-shaped in configuration with the oppositely extending limbs of the generally T-shaped arm means defining the first and second arm means portion, the first and second depressions being generally U-shaped in configuration and positioned such that the first and second arm means portions are positioned to rest in the first and second generally U-shaped impressions under the weight of the arm means, the rotatable means defining a plurality of pairs of spaced apart flange means, each pair of flange means defining a respective first and second depression; and means supported by said flange means for resisting torque forces applied to said arm means while allowing substantially unrestricted insertion and removal of said arm means, said torque forces resisting means comprising a plurality of rods each pivotally mounted adjacent the ends thereof in each respective of the pairs of flanges substantially parallel to the oppositely extending limbs of the respective T-shaped arm means and a pair of hook means attached to extend laterally from each respective rod with a concave side of each of said hook means facing away from the respective rod to form pairs of aligned mouths, the aligned mouths being positioned to contact respective oppositely extending limbs of the respective generally T-shaped arm means as said first and second arm means portions thereof are seated in said respective first and second depressions.

2. The apparatus of claim 1 wherein the plurality of arm means consist of three arm means.

* * * * *